United States Patent
Kuroda et al.

(10) Patent No.: US 10,644,522 B2
(45) Date of Patent: May 5, 2020

(54) ELECTRONIC DEVICE, CONTROL DEVICE, AND METHOD OF CONTROLLING ELECTRONIC DEVICE

(71) Applicant: SHARP KABUSHIKI KAISHA, Sakai, Osaka (JP)

(72) Inventors: Hisashi Kuroda, Sakai (JP); Hiroki Tanabe, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/197,225

(22) Filed: Nov. 20, 2018

(65) Prior Publication Data

US 2019/0157892 A1 May 23, 2019

(30) Foreign Application Priority Data

Nov. 22, 2017 (JP) ................. 2017-225162

(51) Int. Cl.
*H02J 7/00* (2006.01)
*H01M 10/48* (2006.01)
*G01R 31/36* (2020.01)

(52) U.S. Cl.
CPC ........ *H02J 7/0047* (2013.01); *G01R 31/3648* (2013.01); *H01M 10/48* (2013.01); *H02J 7/0068* (2013.01); *H02J 7/0048* (2020.01)

(58) Field of Classification Search
CPC ........ H02J 7/008; H02J 7/0021; H02J 7/0047; H02J 2007/005; H02J 7/0048; H02J 7/0068; B60L 53/62
USPC ........................................ 320/132, 136–137
See application file for complete search history.

(56) References Cited

U.S. PATENT DOCUMENTS

| 2004/0164708 | A1 | 8/2004 | Veselic et al. |
| 2008/0297116 | A1* | 12/2008 | Odaohhara ............. H01M 2/34 320/137 |
| 2010/0219797 | A1 | 9/2010 | Veselic et al. |
| 2010/0308777 | A1 | 12/2010 | Veselic et al. |
| 2011/0133702 | A1 | 6/2011 | Veselic et al. |
| 2011/0260680 | A1 | 10/2011 | Veselic et al. |
| 2013/0169214 | A1* | 7/2013 | Tseng ........................ H02J 7/00 320/107 |
| 2014/0375273 | A1* | 12/2014 | Harada ............. H04W 52/0261 320/136 |
| 2017/0163074 | A1 | 6/2017 | Kimura |
| 2018/0138727 | A1* | 5/2018 | Tamaki ................... A63F 13/23 |

FOREIGN PATENT DOCUMENTS

| JP | 4197189 B2 | 12/2008 |
| JP | 2017-102761 A | 6/2017 |

* cited by examiner

*Primary Examiner* — Paul Dinh
(74) *Attorney, Agent, or Firm* — ScienBiziP, P.C.

(57) ABSTRACT

An electronic device includes a charging power determining section and a control section. The charging power determining section determines a state of the charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold. The control section controls the electronic device to display a result of determination made by the charging power determining section.

6 Claims, 7 Drawing Sheets

ELECTRONIC DEVICE, CONTROL DEVICE, AND METHOD OF CONTROLLING ELECTRONIC DEVICE

This Nonprovisional application claims priority under 35 U.S.C. § 119 on Patent Application No. 2017-225162 filed in Japan on Nov. 22, 2017, the entire contents of which are hereby incorporated by reference.

TECHNICAL FIELD

The present invention relates to an electronic device, a control device, and a method of controlling the electronic device.

BACKGROUND ART

Patent Literature 1 discloses a power information managing device which (i) creates power information related to a plurality of devices and (ii) displays the power information on a certain display screen.

CITATION LIST

Patent Literature

[Patent Literature 1]
Japanese Patent Application Publication Tokukai No. 2017-102761 (Publication date: Jun. 8, 2017)

SUMMARY OF INVENTION

Technical Problem

However, the power information managing device disclosed in Patent Literature 1 merely displays the power information related to the plurality of devices, and is not supposed to display whether or not charging power is adequate for a remaining battery level.

An object of an aspect of the present invention is to display, for a user, whether or not charging power supplied from an external device to a rechargeable battery is adequate for a remaining battery level of the rechargeable battery.

Solution to Problem

In order to attain the above object, an electronic device in accordance with an aspect of the present invention includes: a charging power determining section configured to determine a state of charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold; and a control section configured to control the electronic device to display a result of determination made by the charging power determining section.

A control device in accordance with an aspect of the present invention is a control device for controlling an electronic device including a rechargeable battery, the control device including: a charging power determining section configured to determine a state of charging power with respect to a remaining battery level, with reference to (i) information which indicates whether or not the remaining battery level of the rechargeable battery is lower than a first threshold and (ii) information which indicates whether or not the charging power, which is supplied from an external device to the rechargeable battery, is lower than a second threshold; and a control section configured to control the electronic device to display a result of determination made by the charging power determining section.

A method of controlling an electronic device in accordance with an aspect of the present invention includes the steps of: (a) determining a state of charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold; and (b) controlling the electronic device to display a result of determination made in the step (a).

Advantageous Effects of Invention

An aspect of the present invention makes it possible to display, for a user, whether or not charging power supplied from an external device to a rechargeable battery is adequate for a remaining battery level of the rechargeable battery.

DESCRIPTION OF EMBODIMENTS

Embodiment 1

Figure 1:
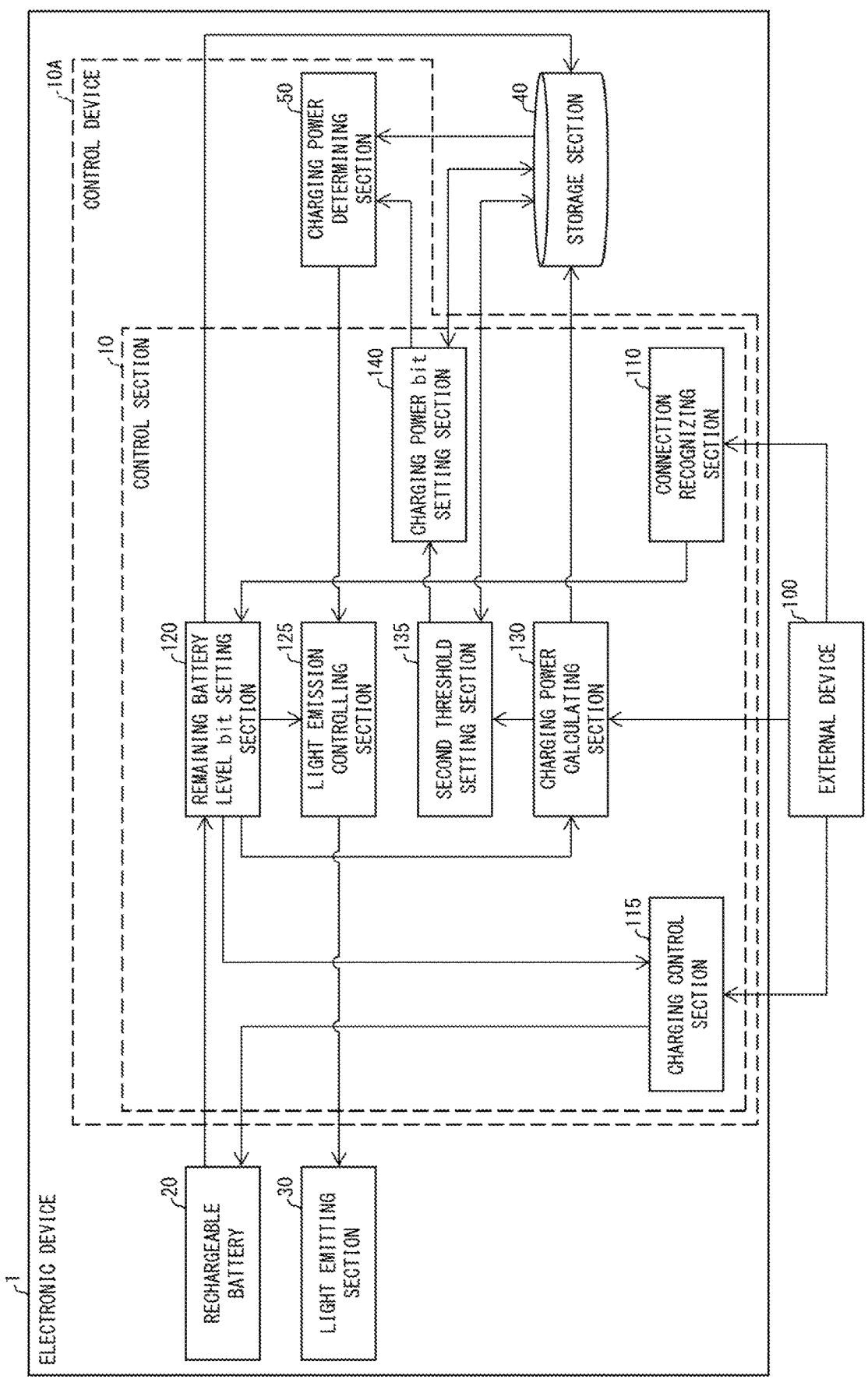
FIG. 1 is a block diagram showing a configuration of an electronic device in accordance with Embodiment 1 of the present invention.
Figure 2:
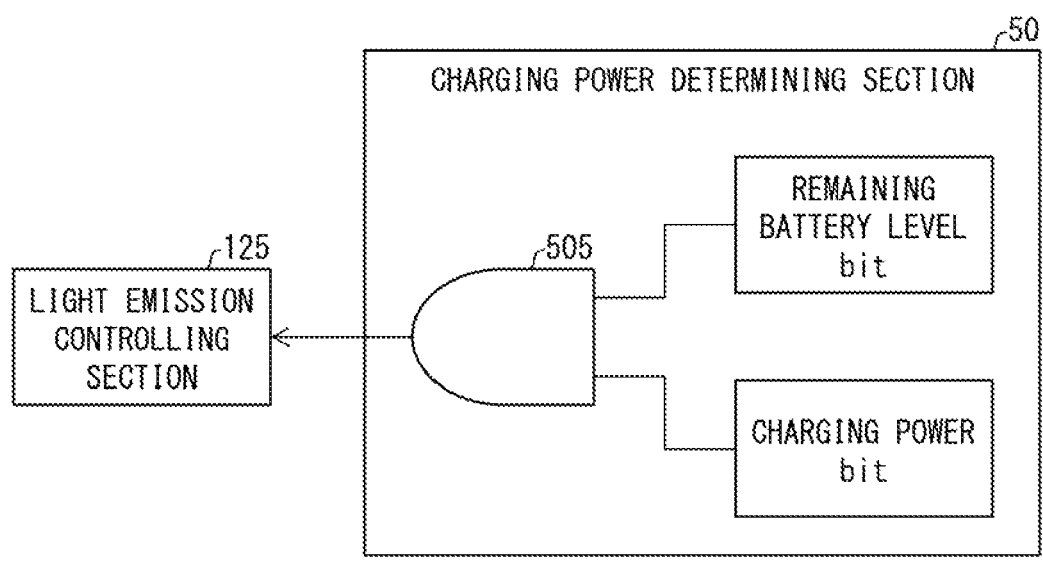
FIG. 2 is a block diagram showing a configuration of a charging power determining section in the electronic device illustrated in FIG. 1.

[Configuration of Electronic Device 1]
FIG. 1 is a block diagram showing a configuration of an electronic device 1 in accordance with Embodiment 1 of the present invention. FIG. 2 is a block diagram showing a configuration of a charging power determining section 50 in the electronic device 1. As is shown in FIG. 1, the electronic device 1 includes a control device 10A, a rechargeable battery 20, a light emitting section 30, and a storage section 40. The control device 10A includes a control section 10 and the charging power determining section 50. The electronic device 1 is connected to an external device 100 so as to receive charging power from the external device 100. The charging power can be indicated by, for example, watt (W). Examples of the electronic device 1 encompass a mobile information terminal such as a smartphone but are not limited to any particular device, provided that the electronic device 1 (i) includes the rechargeable battery 20 and (ii) is connectable to the external device 100.

The control section 10 includes a connection recognizing section 110, a charging control section 115, a remaining battery level bit setting section 120, a light emission controlling section 125, a charging power calculating section 130, a second threshold setting section 135, and a charging power bit setting section 140. The control section 10 is configured to control the electronic device 1.

The connection recognizing section 110 is configured to recognize that the external device 100 has been connected to the electronic device 1. The charging control section 115 is configured to control the rechargeable battery 20 to be charged. Specifically, the charging control section 115 controls switching between constant voltage charging and high speed charging. During the high speed charging, a voltage in charging power is kept higher and a charging speed is kept faster than those during the constant voltage charging. Note that the charging control section 115 can alternatively control switching between constant current charging and high speed charging. During the high speed charging, electric current of charging power is greater and charging speed is faster than those during the constant current charging.

The remaining battery level bit setting section 120 is configured to set, with reference to a remaining battery level of the rechargeable battery 20, a logical value of a remaining battery level bit. The remaining battery level can be indicated by, for example, percent (%). Specifically, in a case where the remaining battery level of the rechargeable battery 20 is equal to or higher than a first threshold, the remaining battery level bit setting section 120 sets, to zero (0), the logical value of the remaining battery level bit. Whereas, in a case where the remaining battery level of the rechargeable battery 20 is lower than the first threshold, the remaining battery level bit setting section 120 sets, to one (1), the logical value of the remaining battery level bit. The first threshold can be set to, for example, 95%. The first threshold indicates a boundary value, based on which it is determined whether or not the remaining battery level of the rechargeable battery 20 is adequate.

The light emission controlling section 125 is configured to control the light emitting section 30 to emit light whose color is variable. The charging power calculating section 130 is configured to calculate charging power supplied from the external device 100 to the rechargeable battery 20.

In a case where the remaining battery level of the rechargeable battery 20 is equal to or higher than a third threshold, the second threshold setting section 135 sets a second threshold to, for example, 10 W. In a case where the remaining battery level of the rechargeable battery 20 is lower than the third threshold, the second threshold setting section 135 sets the second threshold to, for example, 15 W. That is, the second threshold is set by the second threshold setting section 135 so as to be lower (i) in a case where the remaining battery level of the rechargeable battery 20 is equal to or higher than the third threshold than (ii) in a case where the remaining battery level of the rechargeable battery 20 is lower than the third threshold. The second threshold indicates a boundary value, based on which it is determined whether or not the charging power, which is supplied from the external device 100 to the rechargeable battery 20, is adequate.

The third threshold can be set to, for example, 50%. The third threshold is set to be lower than the first threshold. The third threshold indicates a boundary value, based on which it is determined whether or not to invoke a restriction on a processing speed of the electronic device 1. In a case where the remaining battery level of the rechargeable battery 20 is lower than the third threshold, a restriction is invoked on the processing speed of the electronic device 1. Whereas, in a case where the remaining battery level of the rechargeable battery 20 is equal to or higher than the third threshold, the invoked restriction on the processing speed of the electronic device 1 is removed. In a case where the control device 10A can include a central processing unit (CPU), the restriction on the processing speed of the electronic device 1 is invoked by, for example, restricting an operation frequency of the CPU.

The charging power bit setting section 140 sets a logical value of charging power bit, with reference to the charging power supplied from the external device 100 to the rechargeable battery 20. Specifically, in a case where the charging power is equal to or higher than the second threshold, the charging power bit setting section 140 sets, to zero (0), the logical value of the charging power bit. Whereas, in a case where the charging power is lower than the second threshold, the charging power bit setting section 140 sets, to one (1), the logical value of the charging power bit.

The rechargeable battery 20 is provided in the electronic device 1 and can be, for example, a lithium ion battery or a lithium polymer battery. However, the rechargeable battery 20 is not limited to a particular device, provided that it is rechargeable.

The light emitting section 30 is provided in the electronic device 1 and can be, for example, a light emitting diode (LED). By use of (i) light emission color, (ii) lighting, and (iii) blinking in combination, the light emitting section 30 can display a state of the charging power with respect to the remaining battery level of the rechargeable battery 20. Alternatively, by changing (a) light emission color, (b) luminance, and (c) blinking speed, the light emitting section 30 can display the state of the charging power with respect to the remaining battery level of the rechargeable battery 20. Embodiment 1 employs the light emitting section 30 in order to display the state of the charging power with respect to the remaining battery level of the rechargeable battery 20. Embodiment 1 is, however, not limited as such. For example, the state of the charging power with respect to the remaining battery level of the rechargeable battery 20 can alternatively be displayed on a display section, such as a display, of the electronic device 1.

As is shown in FIG. 2, the charging power determining section 50 includes an AND gate 505 which performs a logical multiplication of (i) the logical value of the remaining battery level bit and (ii) the logical value of the charging power bit. The charging power determining section 50 supplies, as a charging power determination signal, the logical multiplication thus performed to the light emission controlling section 125.

Upon connection of the external device 100 to the electronic device 1, the external device 100 supplies charging power to the electronic device 1. The external device 100 can be, for example, a personal computer (PC). However, the external device 100 is not limited to a particular device, provided that it can supply charging power to the electronic device 1. For example, the external device 100 can be a battery charger to which a plurality of charging devices can be connected. The external device 100 and the electronic device 1 are each preferably compliant with, for example, the universal serial bus power delivery (USB-PD) standard. The external device 100 can be connected to the electronic device 1 via, for example, a universal serial bus (USB) cable.

(Operation of Electronic Device 1)

Figure 3:
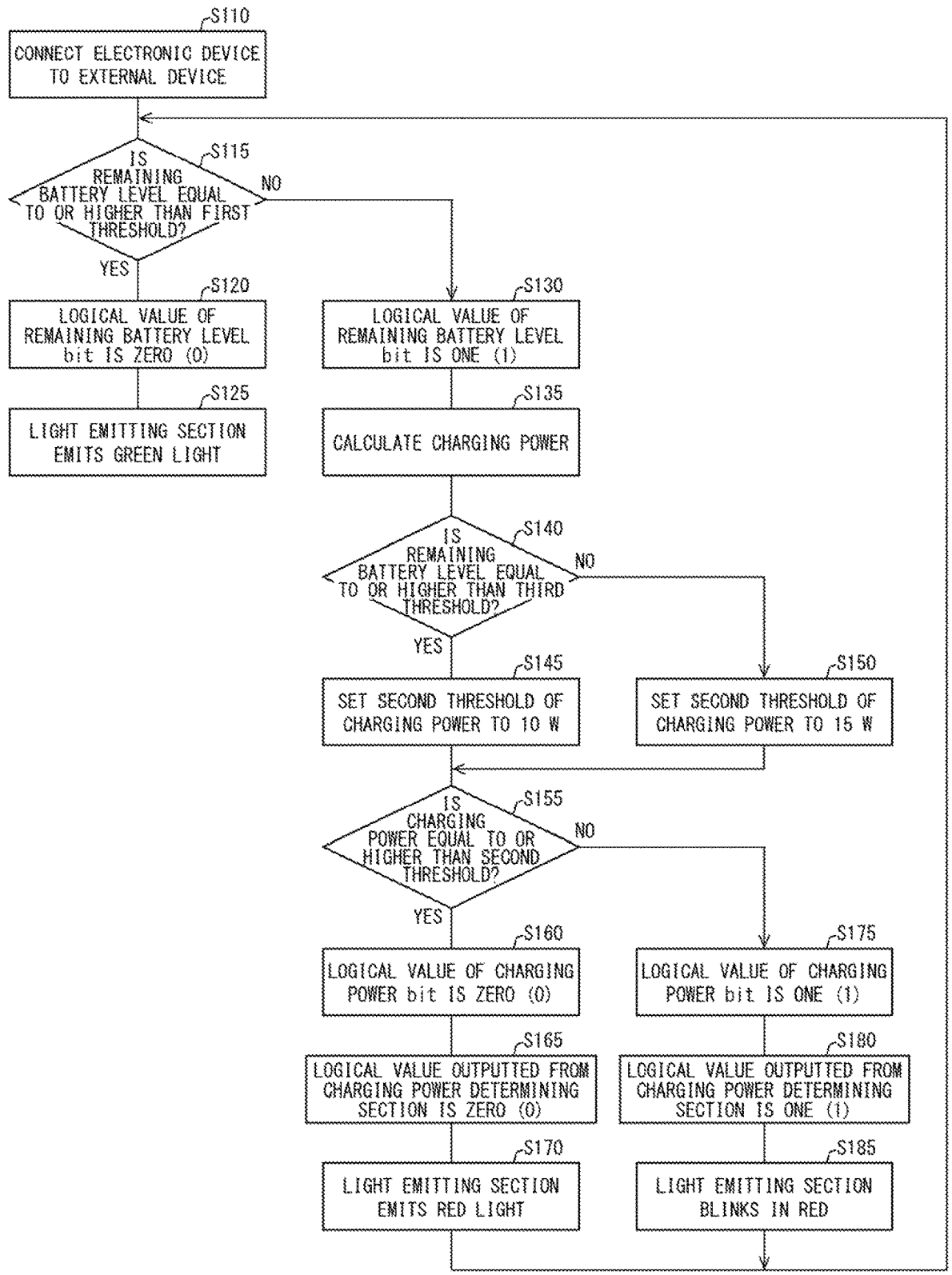
FIG. 3 is a flowchart depicting how the electronic device illustrated in FIG. 1 operates.

Next, the following description will discuss, with reference to FIG. 3, how the electronic device 1 operates. FIG. 3 is a flowchart depicting how the electronic device 1 operates. First, the electronic device 1 is connected to the external device 100 (step S110). In a case where the electronic device 1 is connected to the external device 100, (i) the connection recognizing section 110 recognizes that the external device 100 has been connected to the electronic device 1 and (ii) the charging control section 115 starts to charge the rechargeable battery 20. The connection recognizing section 110 notifies the remaining battery level bit setting section 120 that the external device 100 has been connected to the electronic device 1.

In a case where the remaining battery level bit setting section 120 is notified by the connection recognizing section 110 that the external device 100 has been connected to the electronic device 1, the remaining battery level bit setting section 120 determines whether or not the remaining battery level of the rechargeable battery 20 is equal to or higher than the first threshold (step S115). The remaining battery level bit setting section 120 sets the logical value of the remaining battery level bit, based on a result of determination as to whether or not the remaining battery level of the rechargeable battery 20 is equal to or higher than the first threshold. This will be later described below.

In a case where the remaining battery level of the rechargeable battery 20 is equal to or higher than the first threshold (YES in step S115), the remaining battery level bit setting section 120 sets, to zero (0), the logical value of the remaining battery level bit (step S120). In such a case, the remaining battery level bit setting section 120 notifies the light emission controlling section 125 that the logical value of the remaining battery level bit is zero (0), and causes the storage section 40 to store therein (i) information which indicates that the logical value of the remaining battery level bit is zero (0) and (ii) information indicative of the remaining battery level of the rechargeable battery 20. Note that the fact that the logical value of the remaining battery level bit is zero (0) indicates that (i) the remaining battery level of the rechargeable battery 20 is adequate and (ii) the external device 100 is not required to supply large charging power to the rechargeable battery 20.

In a case where the light emission controlling section 125 is notified by the remaining battery level bit setting section 120 that the logical value of the remaining battery level bit is zero (0), the light emission controlling section 125 controls the light emitting section 30 to emit green light (step S125). The fact that the light emitting section 30 emits green light indicates that (i) the remaining battery level of the rechargeable battery 20 is adequate, and (ii) it is not necessary for the external device 100 to supply large charging power to the rechargeable battery 20.

In contrast, in a case where the remaining battery level of the rechargeable battery 20 is lower than the first threshold (NO in step S115), the remaining battery level bit setting section 120 sets, to one (1), the logical value of the remaining battery level bit (step S130). In such a case, the remaining battery level bit setting section 120 notifies each of the charging control section 115 and the charging power calculating section 130 that the logical value of the remaining battery level bit is one (1), and causes the storage section 40 to store therein (i) information which indicates that the logical value of the remaining battery level bit is one (1) and (ii) information indicative of the remaining battery level of the rechargeable battery 20. In a case where the charging control section 115 is notified by the remaining battery level bit setting section 120 that the logical value of the remaining battery level bit is one (1), the charging control section 115 switches from the constant voltage charging to the high speed charging.

In a case where the charging power calculating section 130 is notified by the remaining battery level bit setting section 120 that the logical value of the remaining battery level bit is one (1), the charging power calculating section 130 calculates charging power which is to be supplied from the external device 100 to the rechargeable battery 20 (step S135). The charging power calculating section 130 supplies, to the second threshold setting section 135, a power value which corresponds to the charging power thus calculated, and then causes the storage section 40 to store therein such a power value.

In a case where the second threshold setting section 135 receives the power value from the charging power calculating section 130, the second threshold setting section 135 determines, with reference to the storage section 40 for the remaining battery level of the rechargeable battery 20, whether or not the remaining battery level is equal to or higher than the third threshold (step S140). In a case where the remaining battery level is equal to or higher than the third threshold (YES in step S140), the second threshold setting section 135 sets the second threshold to, for example, 10 W (step S145). In a case where the remaining battery level is lower than the third threshold (NO in step S140), the second threshold setting section 135 sets the second threshold to, for example, 15 W (step S150). The second threshold setting section 135 causes the storage section 40 to store therein the second threshold thus set, and then instructs the charging power bit setting section 140 to carry out a process.

In a case where the charging power bit setting section 140 is instructed by the second threshold setting section 135 to carry out such a process, the charging power bit setting section 140 determines whether or not the charging power is equal to or higher than the second threshold (step S155), with reference to the power value which (i) corresponds to the charging power that is supplied to the rechargeable battery 20 from the external device 100 and (ii) is stored in the storage section 40.

In a case where the charging power is equal to or higher than the second threshold (YES in step S155), the charging power bit setting section 140 sets, to zero (0), the logical value of the charging power bit (step S160). In such a case, the charging power bit setting section 140 inputs, to one input of the AND gate 505 of the charging power determining section 50, a logical value "zero (0)" as the charging power bit, and then causes the storage section 40 to store therein information which indicates that the logical value of the charging power bit is zero (0).

The charging power determining section 50 refers to the information which (i) indicates that the logical value of the remaining battery level bit is one (1) and (ii) is stored in the storage section 40. A logical value "one (1)" is inputted, as the remaining battery level bit, to one input of the AND gate 505 of the charging power determining section 50. Thus, (i) the logical value "one (1)" is inputted, as the remaining battery level bit, to one input of the AND gate 505 and (ii) the logical value "zero (0)" is inputted, as the charging power bit, to the other input of the AND gate 505. This ultimately causes (i) the AND gate 505 to output zero (0) as a logical value and (ii) the charging power determining section 50 to output zero (0) as a logical value (step S165: determining step).

The charging power determining section 50 supplies, to the light emission controlling section 125, the logical value outputted from the AND gate 505. Note that the fact that the charging power determining section 50 outputs zero (0) as the logical value indicates that (i) the remaining battery level of the rechargeable battery 20 is inadequate and (ii) the charging power, supplied from the external device 100 to the rechargeable battery 20, is adequate. The inadequate remaining battery level indicates that the external device 100 is required to supply large charging power to the rechargeable battery 20. The adequate charging power indicates that the external device 100 has been supplying charging power adequate for the high speed charging.

In a case where the light emission controlling section 125 receives, from the charging power determining section 50, the logical value outputted from the AND gate 505, the light emission controlling section 125 controls the light emitting section 30 to emit red light (controlling step), with reference to the AND gate 505 outputting the logical value of "zero (0)." This causes the light emitting section 30 to emit red light (step S170). The fact that the light emitting section 30 emits red light indicates that (i) the remaining battery level of the rechargeable battery 20 is inadequate and (ii) the charging power, supplied from the external device 100 to the rechargeable battery 20, is adequate. After that, the step S115 and subsequent steps are proceeded with while the light emitting section 30 is emitting red light.

In contrast, in a case where the charging power supplied from the external device 100 to the rechargeable battery 20 is lower than the second threshold (NO in step S155), the charging power bit setting section 140 sets, to one (1), the logical value of the charging power bit (step S175). In such a case, the charging power bit setting section 140 inputs, to one input of the AND gate 505 of the charging power determining section 50, a logical value "one (1)" as the charging power bit, and causes the storage section 40 to store therein information which indicates that the logical value of the charging power bit is one (1).

The charging power determining section 50 refers to the information which (i) indicates that the logical value of the remaining battery level bit is one (1) and (ii) is stored in the storage section 40. A logical value "one (1)" is inputted, as the remaining battery level bit, to one input of the AND gate 505 of the charging power determining section 50. Thus, (i) the logical value "one (1)" bit is inputted, as the remaining battery level bit, to one input of the AND gate 505 and (ii) the logical value "one (1)" is inputted, as the charging power bit, to the other input of the AND gate 505. This ultimately causes (i) the AND gate 505 to output one (1) as a logical value and (ii) the charging power determining section 50 to output one (1) as a logical value (step S180: determining step). The charging power determining section 50 supplies, to the light emission controlling section 125, the logical value outputted from the AND gate 505. Note that the fact that the charging power determining section 50 outputs one (1) as the logical value indicates that (i) the remaining battery level of the rechargeable battery 20 is inadequate and (ii) the charging power, supplied from the external device 100 to the rechargeable battery 20, is inadequate. The inadequate charging power indicates that the external device 100 has not been supplying charging power adequate for the high speed charging.

In a case where the light emission controlling section 125 receives, from the charging power determining section 50, the logical value outputted from the AND gate 505, the light emission controlling section 125 controls the light emitting section 30 to blink in red (controlling step), with reference to the AND gate 505 outputting the logical value of "one (1)." This causes the light emitting section 30 to blink in red (step S185). The fact that the light emitting section 30 blinks in red indicates that (i) the remaining battery level of the rechargeable battery 20 is inadequate and (ii) the charging power, supplied from the external device 100 to the rechargeable battery 20, is inadequate. After that, the step S115 and subsequent steps are proceeded with while the light emitting section 30 is blinking in red.

According to the electronic device 1, the charging power determining section 50 refers to (i) information which indicates whether or not the remaining battery level of the rechargeable battery 20 is lower than the first threshold and (ii) information which indicates whether or not the charging power supplied from the external device 100 to the rechargeable battery 20 is lower than the second threshold. The charging power determining section 50 determines a state of the charging power with respect to the remaining battery level. Furthermore, the control section 10 controls the electronic device 1 to display a result of determination made by the charging power determining section 50. This makes it possible to display, for a user, whether or not the charging power supplied from the external device 100 to the rechargeable battery 20 is adequate for the remaining battery level of the rechargeable battery 20.

In a case where (i) the remaining battery level of the rechargeable battery 20 is lower than the first threshold and (ii) the charging power is equal to or higher than the second threshold, the charging power determining section 50 determines that the remaining battery level is inadequate and that the charging power is adequate. Meanwhile, in a case where (a) the remaining battery level is lower than the first threshold and (b) the charging power is lower than the second threshold, the charging power determining section 50 determines that the remaining battery level and the charging power are inadequate. This makes it possible to display, for the user, whether or not the charging power is adequate for the remaining battery level, by setting (i) the first threshold as a boundary value based on which it is determined whether or not the remaining battery level is adequate and (ii) the second threshold as a boundary value based on which it is determined whether or not the charging power is adequate.

Moreover, the second threshold is set by the control section 10 so as to be lower (i) in a case where the remaining battery level is equal to or higher than the third threshold than (ii) in a case where the remaining battery level is lower than the third threshold. Furthermore, the control section 10 sets the third threshold to be lower than the first threshold. This allows the control section 10 to set the second threshold while considering a restriction on a processing speed of the electronic device 1, in a case where, for example, the third threshold indicates a boundary value based on which it is determined whether to invoke a restriction on the processing speed of the electronic device 1.

Embodiment 21

Figure 4:
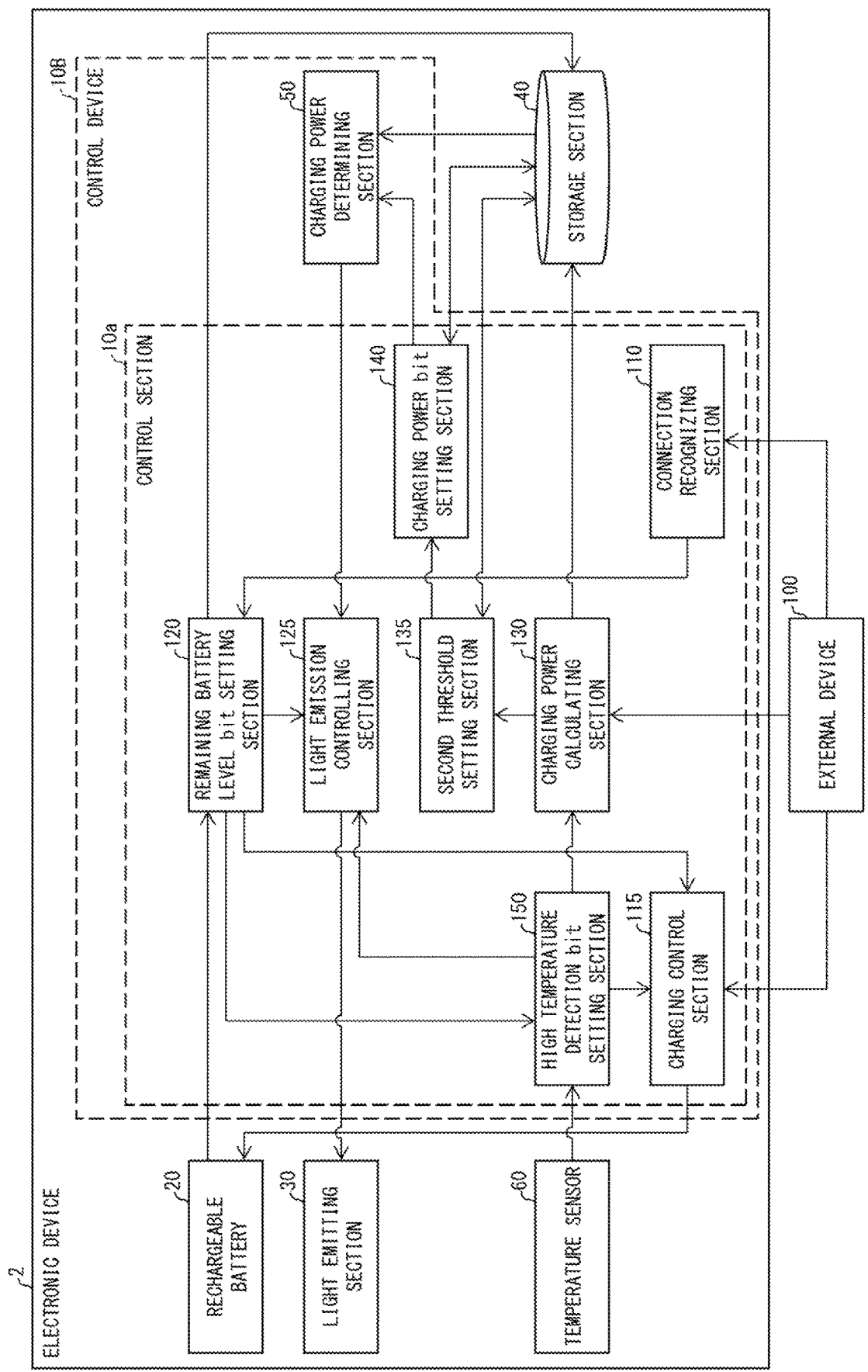
FIG. 4 is a block diagram showing a configuration of an electronic device in accordance with Embodiment 2 of the present invention.

FIG. 4 is a block diagram showing a configuration of an electronic device 2 in accordance with Embodiment 2 of the present invention. For convenience, members having functions identical to those of members discussed in Embodiment 1 are given the same reference signs, and descriptions of such members are not repeated.

(Configuration of Electronic Device 2)

As is shown in FIG. 4, the electronic device 2 differs from the electronic device 1 in that it (i) includes a control device 10B instead of the control device 10A and (ii) further includes a temperature sensor 60. The control device 10B differs from the control device 10A in that it includes a control section 10*a* instead of the control section 10. The control section 10*a* differs from the control section 10 in that it further includes a high temperature detection bit setting section 150.

The temperature sensor 60 detects an internal temperature of the electronic device 2. Specifically, the temperature sensor 60 can detect, for example, a temperature of a rechargeable battery 20. Furthermore, the temperature sensor 60 can detect a temperature of a part which is related to charging of the rechargeable battery 20, i.e., a temperature of at least a part of members of the electronic device 1 which are located between an external device 100 and the rechargeable battery 20. The internal temperature of the electronic device 2 can be indicated by, for example, degrees Celsius (° C.).

The high temperature detection bit setting section 150 sets a logical value of a high temperature detection bit, with reference to the internal temperature of the electronic device 2 which is detected by the temperature sensor 60. Specifically, in a case where the internal temperature is equal to or higher than a predetermined temperature threshold, the high temperature detection bit setting section 150 sets, to one (1), the logical value of the high temperature detection bit. Whereas, in a case where the internal temperature is lower than the predetermined temperature threshold, the high temperature detection bit setting section 150 sets, to zero (0), the logical value of the high temperature detection bit. The predetermined temperature threshold is preferably set to, for example, 70° C. The predetermined temperature threshold indicates a boundary value, based on which it is determined whether or not the internal temperature of the electronic device 2 has become too high.

(Operation of Electronic Device 2)

Figure 5:
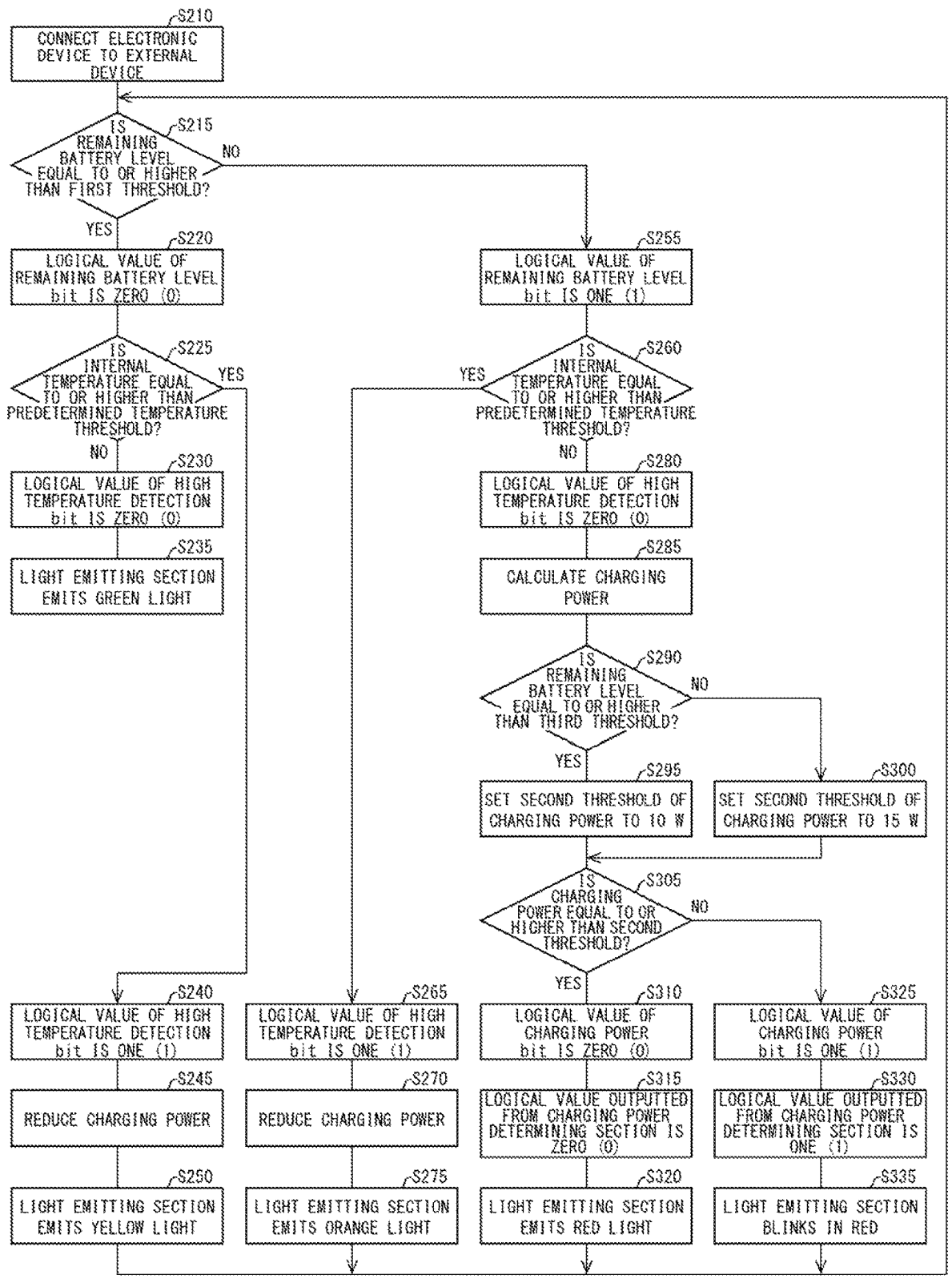
FIG. 5 is a flowchart depicting how the electronic device illustrated in FIG. 4 operates.

The following description will discuss, with reference to FIG. 5, how the electronic device 2 operates. FIG. 5 is a flowchart depicting how the electronic device 2 operates. Note that the steps S210 though S220 are similar to the steps S110 through S120, respectively, and therefore descriptions of such steps are not repeated. After the step S220, a remaining battery level bit setting section 120 instructs the high temperature detection bit setting section 150 to carry out a process.

In a case where the high temperature detection bit setting section 150 is instructed by the remaining battery level bit setting section 120 to carry out a process, the high temperature detection bit setting section 150 determines, with reference to the internal temperature of the electronic device 2 detected by the temperature sensor 60, whether or not the internal temperature is equal to or higher than the predetermined temperature threshold (step S225).

In a case where the internal temperature of the electronic device 2 is equal to or higher than the predetermined temperature threshold (YES in step S225), the high temperature detection bit setting section 150 sets, to one (1), the logical value of the high temperature detection bit (step S240). In such a case, the high temperature detection bit setting section 150 notifies each of a charging control section 115 and a light emission controlling section 125 that the logical value of the high temperature detection bit is one (1), and then causes a storage section 40 to store therein (i) information which indicates that the logical value of the high temperature detection bit is one (1) and (ii) information indicative of the internal temperature. Note that the fact that the logical value of the high temperature detection bit is one (1) indicates that the internal temperature is high.

In a case where the charging control section 115 is notified by the high temperature detection bit setting section 150 that the logical value of the high temperature detection bit is one (1), the charging control section 115 controls the external device 100 to reduce charging power which is supplied to the rechargeable battery 20 (step S245). Note that, instead of the reduction in charging power, the charging control section 115 can alternatively control the external device 100 to stop charging the rechargeable battery 20. The light emission controlling section 125 is notified by the remaining battery level bit setting section 120 that a logical value of a remaining battery level bit is zero (0), and is also notified by the high temperature detection bit setting section 150 that the logical value of the high temperature detection bit is one (1). After that, the light emission controlling section 125 controls a light emitting section 30 to emit yellow light. This causes the light emitting section 30 to emit yellow light (step S250). The fact that the light emitting section 30 emits yellow light indicates that that (i) a remaining battery level of the rechargeable battery 20 is adequate and (ii) the internal temperature of the electronic device 2 is high.

In contrast, in a case where the internal temperature of the electronic device 2 is lower than the predetermined temperature threshold (NO in step S225), the high temperature detection bit setting section 150 sets, to zero (0), the logical value of the high temperature detection bit (step S230). In such a case, the high temperature detection bit setting section 150 notifies the light emission controlling section 125 that the logical value of the high temperature detection bit is zero (0), and then causes the storage section 40 to store therein (i) information which indicates that the logical value of the high temperature detection bit is zero (0) and (ii) information indicative of the internal temperature of the electronic device 2. Note that the fact that the logical value of the high temperature detection bit is zero (0) indicates that the internal temperature is not high.

The light emission controlling section 125 is notified by the remaining battery level bit setting section 120 that the logical value of the remaining battery level bit is zero (0), and is also notified by the high temperature detection bit setting section 150 that the logical value of the high temperature detection bit is zero (0). After that, the light emission controlling section 125 controls the light emitting section 30 to emit green light. The fact that the light emitting section 30 emits green light indicates that (i) the remaining battery level of the rechargeable battery 20 is adequate and (ii) the internal temperature of the electronic device 2 is not high.

After the step S255, the remaining battery level bit setting section 120 instructs the high temperature detection bit setting section 150 to carry out a process. The step S255 is similar to the step S130, and therefore a description of the step S255 is not repeated.

In a case where the high temperature detection bit setting section 150 is instructed by the remaining battery level bit setting section 120 to carry out a process, the high temperature detection bit setting section 150 determines, with reference to the internal temperature of the electronic device 2 detected by the temperature sensor 60, whether or not the internal temperature is equal to or higher than the predetermined temperature threshold (step S260).

In a case where the internal temperature of the electronic device 2 is equal to or higher than the predetermined temperature threshold (YES in step S260), the high temperature detection bit setting section 150 sets, to one (1), the logical value of the high temperature detection bit (step S265). In such a case, the high temperature detection bit setting section 150 notifies each of the charging control section 115 and the light emission controlling section 125 that the logical value of the high temperature detection bit is one (1), and then causes the storage section 40 to store (i) information which indicates that the logical value of the high temperature detection bit is one (1) and (ii) information indicative of the internal temperature of the electronic device 2.

In a case where the charging control section 115 is notified by the high temperature detection bit setting section 150 that the logical value of the high temperature detection bit is one (1), the charging control section 115 controls the external device 100 to reduce the charging power which is supplied to the rechargeable battery 20 (step S270). Note that, instead of the reduction in charging power, the charging control section 115 can alternatively control the external device 100 to stop charging the rechargeable battery 20. The light emission controlling section 125 is notified by the remaining battery level bit setting section 120 that the logical value of the remaining battery level bit is one (1), and is also notified by the high temperature detection bit setting section 150 that the logical value of the high temperature detection bit is one (1). After that, the light emission controlling section 125 controls the light emitting section 30 to emit orange light. This causes the light emitting section 30 to emit orange light (step S275). The fact that the light emitting section 30 emits orange light indicates that (i) the remaining battery level of the rechargeable battery 20 is inadequate and (ii) the internal temperature of the electronic device 2 is high.

In a case where the internal temperature of the electronic device 2 is lower than the predetermined temperature threshold (NO in step S260), the high temperature detection bit setting section 150 sets, to zero (0), the logical value of the high temperature detection bit (step S280). In such a case, the high temperature detection bit setting section 150 notifies a charging power calculating section 130 that the logical value of the high temperature detection bit is zero (0), and then causes the storage section 40 to store therein (i) information which indicates that the logical value of the high temperature detection bit is zero (0) and (ii) information indicative of the internal temperature of the electronic device 2. After that, the step S285 and subsequent steps are proceeded with. Note that the steps S285 through S335 are similar to the steps S135 through S185, respectively, and therefore descriptions of such steps are not repeated.

As has been described, the control section 10a of the electronic device 2 refers to information which indicates whether or not the internal temperature of the electronic device 2, detected by the temperature sensor 60, is equal to or higher than the predetermined temperature threshold. In a case where the internal temperature is equal to or higher than the predetermined temperature threshold, the control section 10a determines that the internal temperature is high. In such a case, the control section 10a controls the charging power, supplied from the external device 100 to the rechargeable battery 20, to be reduced. According to a typical electronic device, in a case where (i) charging is carried out under a high temperature condition or (ii) high speed charging is carried out for a long period of time, an increase in temperature of a rechargeable battery invokes (a) control in which charging power is reduced or (b) control in which charging is stopped. However, according to a conventional electronic device, even in a case where such control in which charging power is reduced or such control in which charging is stopped is invoked, a user may sometimes not be notified of such invoking. Embodiment 2 makes it possible to notify the user of a state of current charging, even in a case where such control is invoked.

The control section 10a controls the electronic device 2 to display a reduction in charging power by the control section 10a. This makes it possible to display, for the user, that the charging power supplied from the external device 100 to the rechargeable battery 20 has been reduced due to an increase in internal temperature of the electronic device 2.

Embodiment 3

Figure 6:
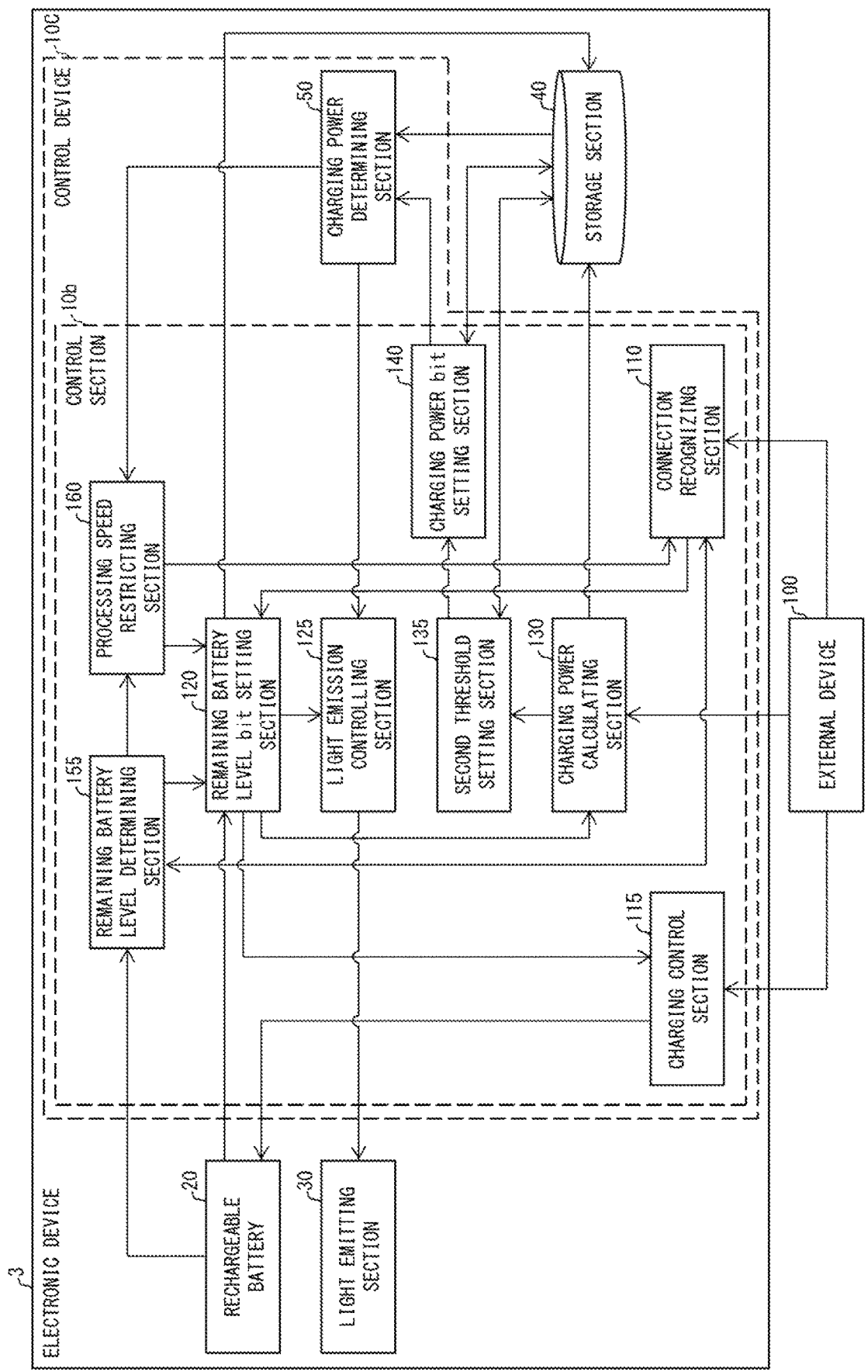
FIG. 6 is a block diagram showing a configuration of an electronic device in accordance with Embodiment 3 of the present invention.
Figure 7:
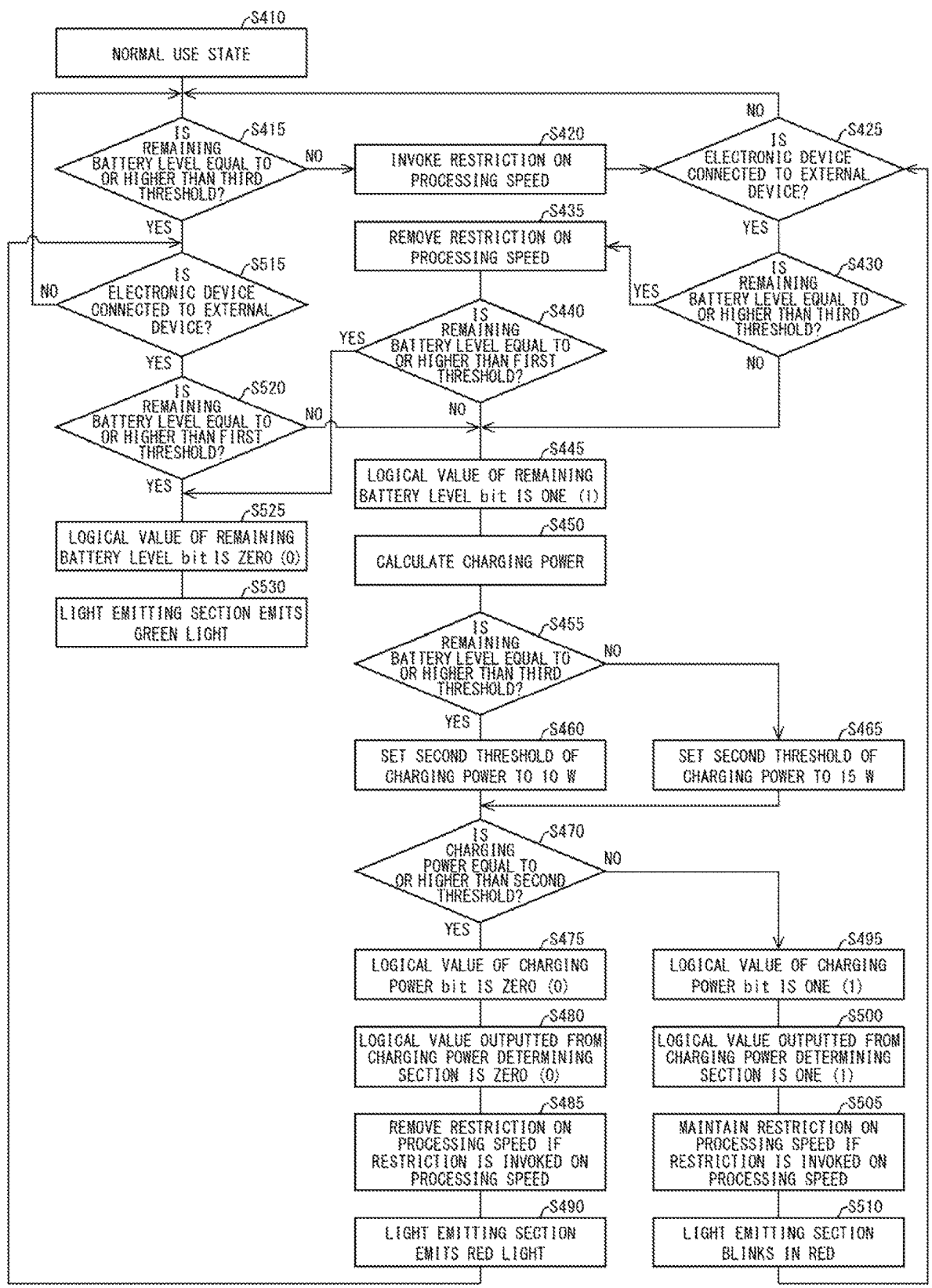
FIG. 7 is a flowchart depicting how the electronic device illustrated in FIG. 6 operates.

FIG. 6 is a block diagram showing a configuration of an electronic device 3 in accordance with Embodiment 3 of the present invention. FIG. 7 is a flowchart depicting how the electronic device 3 operates. For convenience, members having functions identical to those of members discussed in Embodiments 1 and 2 are given the same reference signs, and descriptions of such members are not repeated.

(Configuration of Electronic Device 3)

As is shown in FIG. 6, the electronic device 3 differs from the electronic device 1 in that it includes a control device 10C, instead of the control device 10A. The control device 10C differs from the control device 10A in that it includes a control section 10b instead of the control section 10. The control section 10b differs from the control section 10 in that it includes a remaining battery level determining section 155 and a processing speed restricting section 160.

The remaining battery level determining section 155 determines, with reference to a remaining battery level of a rechargeable battery 20, whether or not the remaining battery level of the rechargeable battery 20 is equal to or higher than a third threshold. In a case where the remaining battery level of the rechargeable battery 20 is lower than the third threshold, the processing speed restricting section 160 invokes a restriction on a processing speed of the electronic device 3.

(Operation of Electronic Device 3)

The following description will discuss, with reference to FIG. 7, how the electronic device 3 operates. Assume here that (i) the electronic device 3 has not been connected to an external device 100 and (ii) the electronic device 3 is in a usable state (step S410). The remaining battery level determining section 155 determines, with reference to the remaining battery level of the rechargeable battery 20, whether or not the remaining battery level of the rechargeable battery 20 is equal to or higher than the third threshold (step S415).

In a case where the remaining battery level of the rechargeable battery 20 is equal to or higher than the third threshold (YES in step S415), the remaining battery level determining section 155 instructs a connection recognizing section 110 to determine whether or not the electronic device 3 is connected to the external device 100. After that, the connection recognizing section 110 determines whether or not the electronic device 3 is connected to the external device 100 (step S515).

In a case where the electronic device 3 is connected to the external device 100 (YES in step S515), a charging control section 115 controls the rechargeable battery 20 to start charging. The connection recognizing section 110 instructs a remaining battery level bit setting section 120 to carry out a process, and then the step S520 is proceeded with. The steps S520 through S530 are similar to the steps S115 through S125, respectively, and therefore descriptions of such steps are not repeated. Note that, in a case where the electronic device 3 is not connected to the external device 100 (NO in step S515), the step S415 is proceeded with.

In a case where the remaining battery level of the rechargeable battery 20 is lower than the third threshold (NO in step S415), the remaining battery level determining section 155 instructs the processing speed restricting section 160 to invoke a restriction on the processing speed of the electronic device 3. In a case where the processing speed restricting section 160 is instructed, by the remaining battery level determining section 155, to invoke a restriction on the processing speed of the electronic device 3, the processing speed restricting section 160 invokes a restriction on the processing speed of the electronic device 3 (step S420).

After invoking the restriction on the processing speed of the electronic device 3, the processing speed restricting section 160 instructs the connection recognizing section 110 to determine whether or not the electronic device 3 is connected to the external device 100. Then, the connection recognizing section 110 determines whether or not the electronic device 3 is connected to the external device 100 (step S425).

In a case where the electronic device 3 is connected to the external device 100 (YES in step S425), (i) the charging control section 115 starts charging the rechargeable battery 20, (ii) the connection recognizing section 110 instructs the remaining battery level determining section 155 to carry out a process, and (iii) the step S430 is proceeded with. In contrast, in a case where the electronic device 3 is not connected to the external device 100 (NO in step S425), the connection recognizing section 110 instructs the processing speed restricting section 160 to maintain the restriction on the processing speed of the electronic device 3. The processing speed restricting section 160 then maintains the restriction on the processing speed of the electronic device 3. After that, the step S415 is proceeded with.

After the step S425, in a case where the remaining battery level determining section 155 is instructed, by the connection recognizing section 110, to carry out a process, the remaining battery level determining section 155 determines whether or not the remaining battery level of the rechargeable battery 20 is equal to or higher than the third threshold (step S430). In a case where the remaining battery level of the rechargeable battery 20 is equal to or higher than the third threshold (YES in step S430), the remaining battery level determining section 155 instructs the processing speed restricting section 160 to remove the restriction on the processing speed of the electronic device 3. In a case where the processing speed restricting section 160 is instructed, by the remaining battery level determining section 155, to remove the restriction on the processing speed of the electronic device 3, the processing speed restricting section 160 removes the restriction on the processing speed of the electronic device 3 (step S435).

After removing the restriction on the processing speed of the electronic device 3, the processing speed restricting section 160 instructs the remaining battery level bit setting section 120 to carry out a process. After that, the step S440 is proceeded with. The steps S440 through S480 are similar to the steps S115 and S130 through S165, respectively, and therefore descriptions of such steps are not repeated.

In a case where the remaining battery level of the rechargeable battery 20 is lower than the third threshold (NO in step S430), the remaining battery level determining section 155 notifies the remaining battery level bit setting section 120 that the remaining battery level of the rechargeable battery 20 is lower than the third threshold. In a case where the remaining battery level bit setting section 120 is notified that the remaining battery level of the rechargeable battery 20 is lower than the third threshold, the remaining battery level bit setting section 120 recognizes that the remaining battery level of the rechargeable battery 20 is lower than a first threshold. This is because the third threshold is lower than the first threshold. This causes the remaining battery level bit setting section 120 to set, to one (1), a logical value of a remaining battery level bit (step S445). Then, the step S450 and subsequent steps are proceeded with.

In a case where a restriction is invoked, after the step S480, on the processing speed of the electronic device 3, a charging power determining section 50 instructs the processing speed restricting section 160 to remove the restriction on the processing speed of the electronic device 3. In a case where the processing speed restricting section 160 is instructed, by the charging power determining section 50, to remove the restriction on the processing speed of the electronic device 3, the processing speed restricting section 160 removes the restriction on the processing speed of the electronic device 3 (step S485).

The charging power determining section 50 concurrently (i) supplies, to a light emission controlling section 125, a logical value outputted from an AND gate 505 and (ii) instructs the processing speed restricting section 160 to remove the restriction on the processing speed of the electronic device 3. Then, the step S490 is proceeded with. Note that the step S490 is similar to the step S170, and a description of the step S490 is therefore not repeated. After the step S490, the step S515 is proceeded with.

In a case where charging power, which is supplied from the external device 100 to the rechargeable battery 20, is lower than a second threshold in the step S470 (NO in step S470), the steps S495 and S500 are sequentially proceeded with. Note that the steps S495 and S500 are similar to the steps S175 and S180, respectively, and therefore descriptions of such steps are not repeated.

In a case where a restriction is invoked, after the step S500, on the processing speed of the electronic device 3, the charging power determining section 50 instructs the processing speed restricting section 160 to maintain the restriction on the processing speed of the electronic device 3. In a case where the processing speed restricting section 160 is instructed, by the remaining battery level determining section 155, to maintain the restriction on the processing speed of the electronic device 3, the processing speed restricting section 160 maintains the restriction on the processing speed of the electronic device 3 (step S505).

The charging power determining section 50 concurrently (i) supplies the logical value outputted from the AND gate 505 to the light emission controlling section 125 and (ii) instructs the processing speed restricting section 160 to maintain the restriction on the processing speed of the electronic device 3. Then, the step S510 is proceeded with. Note that the step S510 is similar to the step S185, and therefore a description of the step S510 is not repeated. After the step S510, the step S425 is proceeded with.

As has been described, the control section 10b of the electronic device 3 invokes a restriction on the processing speed of the electronic device 3, in a case where the remaining battery level of the rechargeable battery 20 is lower than the third threshold. The control section 10b removes the restriction on the processing speed of the electronic device 3, in a case where (i) the remaining battery level is equal to or higher than the third threshold or (ii) the remaining battery level is lower than the first threshold and the charging power, supplied from the external device 100 to the rechargeable battery 20, is equal to or higher than the second threshold. This causes a restriction to be invoked on the processing speed of the electronic device 3, in a case where the remaining battery level of the rechargeable battery 20 is lower than the third threshold. As such, the rechargeable battery 20 is allowed to have a long life. Furthermore, it is possible to prevent power consumption from becoming greater than charging power while, for example, the rechargeable battery 20 is being charged. This makes it possible to reduce the possibility that the rechargeable battery 20 is not charged.

Software Implementation Example

Control blocks of each of the control devices 10A, 10B, and 10C (particularly, the charging power determining section 50, the connection recognizing section 110, the charging control section 115, the remaining battery level bit setting section 120, the light emission controlling section 125, the charging power calculating section 130, the second threshold setting section 135, the charging power bit setting section 140, the high temperature detection bit setting section 150, the remaining battery level determining section 155, and the processing speed restricting section 160) can be realized by a logic circuit (hardware) provided in an integrated circuit (IC chip) or the like or can be alternatively realized by software.

In the latter case, each of the control devices 10A, 10B, and 10C includes a computer that executes instructions of a program that is software realizing the foregoing functions. The computer includes, for example, at least one processor (control device) and at least one computer-readable storage medium in which the program is stored. An object of the present invention can be achieved by the processor of the computer, which processor reads and executes the program stored in the storage medium. Examples of the processor encompass a CPU. Examples of the storage medium encompass "a non-transitory tangible medium" such as a read only memory (ROM), a tape, a disk, a card, a semiconductor memory, and a programmable logic circuit. The computer can further include a random access memory (RAM) in which the program is loaded. The program can be supplied to or made available to the computer via any transmission medium (such as a communication network or a broadcast wave) which allows the program to be transmitted. Note that an aspect of the present invention can also be achieved in the form of a computer data signal in which the program is embodied via electronic transmission and which is embedded in a carrier wave.

[Recap]

Each of electronic devices 1, 2, and 3 in accordance with a first aspect of the present invention includes: a charging power determining section 50 configured to determine a state of charging power with respect to a remaining battery level, with reference to (i) information which indicates whether or not the remaining battery level of a rechargeable battery 20 is lower than a first threshold and (ii) information which indicates whether or not the charging power, which is supplied from an external device 100 to the rechargeable battery, is lower than a second threshold; and a control section 10, 10a, or 10b configured to control the electronic device to display a result of determination made by the charging power determining section.

The above configuration makes it possible to display, for a user, whether or not the charging power is adequate for the remaining battery level, by setting (i) the first threshold as a boundary value based on which it is determined whether or not the remaining battery level is adequate and (ii) the second threshold as a boundary value based on which it is determined whether or not the charging power is adequate.

Each of the electronic devices 1, 2, and 3 in accordance with a second aspect of the present invention can be configured such that, in the first aspect of the present invention, the charging power determining section 50 determines that the remaining battery level is inadequate and that the charging power is adequate, in a case where (i) the remaining battery level is lower than the first threshold and (ii) the charging power is equal to or higher than the second threshold; and the charging power determining 50 section determines that the remaining battery level and the charging power are inadequate, in a case where the remaining battery level is lower than the first threshold and the charging power is lower than the second threshold.

The above configuration makes it possible to display, for the user, whether or not the charging power supplied from the external device to the rechargeable battery is adequate for the remaining battery level of the rechargeable battery.

Each of the electronic devices 1, 2, and 3 in accordance with a third aspect of the present invention can be configured such that, in the second aspect of the present invention, the second threshold is set by the control section 10, 10a, or 10b so as to be lower (i) in a case where the remaining battery level is equal to or higher than a third threshold than (ii) in a case where the remaining battery level is lower than the third threshold, the third threshold being lower than the first threshold.

The above configuration allows the control section to set the second threshold while considering a restriction on the processing speed of the electronic device, in a case where, for example, the third threshold indicates a boundary value based on which it is determined whether or not to invoke a restriction on the processing speed of the electronic device 1.

The electronic device 2 in accordance with a fourth aspect of the present invention can be configured to further include, in any one of the first through third aspects of the present invention, a temperature sensor 60 configured to detect an internal temperature of the electronic device, wherein the control section 10a (i) refers to information which indicates whether or not the internal temperature detected by the temperature sensor is equal to or higher than a predetermined temperature threshold, (ii) determines, in a case where the internal temperature is equal to or higher than the predetermined temperature threshold, that the internal temperature is high, and (iii) reduces the charging power in a case where it is determined that the internal temperature is high.

The above configuration makes it possible to reduce damages to each member in the electronic device due to an excessive increase in internal temperature of the electronic device, by setting the predetermined temperature threshold as a boundary value based on which it is determined whether or not the internal temperature of the electronic device has become too high.

The electronic device 2 in accordance with a fifth aspect of the present invention can be configured such that, in the fourth aspect of the present invention, the control section 10a controls the electronic device to display a reduction in charging power made by the control section.

The above configuration makes it possible to display, for the user, that the charging power supplied from the external device to the rechargeable battery is reduced due to an increase in internal temperature of the electronic device.

The electronic device 3 in accordance with a sixth aspect of the present invention can be configured such that, in any one of the first through fifth aspects of the present invention, the control section 10b invokes a restriction on a processing speed of the electronic device, in a case where the remaining battery level is lower than a third threshold which is lower than the first threshold; and the control section removes the restriction, in a case where the remaining battery level is equal to or higher than the third threshold or in a case where the remaining battery level is lower than the first threshold and the charging power is equal to or higher than the second threshold.

The above configuration causes a restriction to be invoked on the processing speed of the electronic device in a case where the remaining battery level of the rechargeable battery is lower than the third threshold. This allows the rechargeable battery to have a long life. Furthermore, it is possible to prevent power consumption from becoming greater than charging power while, for example, the rechargeable battery is being charged. This makes it possible to reduce the possibility that the rechargeable battery is not charged.

A control device in accordance with a seventh aspect of the present invention is a control device 1, 2, or 3 for controlling an electronic device including a rechargeable battery 20, the control device including: a charging power determining section 50 configured to determine a state of charging power with respect to a remaining battery level, with reference to (i) information which indicates whether or not the remaining battery level of the rechargeable battery is lower than a first threshold and (ii) information which indicates whether or not the charging power, which is supplied from an external device 100 to the rechargeable battery, is lower than a second threshold; and a control section 10, 10a, or 10b configured to control the electronic device to display a result of determination made by the charging power determining section. The above configuration brings about the same effect as that brought about by the first aspect of the present invention.

A method of controlling each of the electronic devices 1, 2, and 3 in accordance with an eighth aspect of the present invention includes the steps of: (a) determining a state of charging power with respect to a remaining battery level, with reference to (i) information which indicates whether or not the remaining battery level of a rechargeable battery 20 is lower than a first threshold and (ii) information which indicates whether or not the charging power, which is supplied from an external device 100 to the rechargeable battery, is lower than a second threshold; and (b) controlling the electronic device to display a result of determination made in the step (a). The above configuration brings about the same effect as that brought about by the first aspect of the present invention.

The charging power determining section and the control section in accordance with each aspect of the present invention may be realized by a computer. In such a case, the scope of the present invention encompasses (i) a control program for the control section which control program causes the computer to operate as each section (software element) of the control section so that the control section can be realized by the computer and (ii) a computer-readable storage medium in which the control program is stored.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1, 2, 3: Electronic device
10, 10a, 10b: Control section
10A, 10B, 10C: Control device
20: Rechargeable battery
30: Light emitting section
40: Storage section
50: Charging power determining section
60: Temperature sensor
100: External device
110: Connection recognizing section
115: Charging control section
120: Remaining battery level bit setting section
125: Light emission controlling section
130: Charging power calculating section
135: Second threshold setting section
140: Charging power bit setting section
150: High temperature detection bit setting section
155: Remaining battery level determining section
160: Processing speed restricting section
505: AND gate

The invention claimed is:

1. An electronic device, comprising:
a charging power determining section configured to determine a state of charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold; and
a control section configured to control the electronic device to display a result of determination made by the charging power determining section,
the control section controlling the electronic device to display the result so as to indicate that (i) the remaining battery level of the rechargeable battery is lower than the first threshold and (ii) the charging power supplied from the external device to the rechargeable battery is lower than the second threshold.

2. The electronic device as set forth in claim 1, wherein:
the charging power determining section determines that the remaining battery level is inadequate and that the charging power is adequate, in a case where (i) the remaining battery level is lower than the first threshold and (ii) the charging power is equal to or higher than the second threshold; and
the charging power determining section determines that the remaining battery level and the charging power are inadequate, in a case where the remaining battery level is lower than the first threshold and the charging power is lower than the second threshold.

3. The electronic device as set forth in claim 2, wherein:
the second threshold is set by the control section so as to be lower (i) in a case where the remaining battery level is equal to or higher than a third threshold than (ii) in a case where the remaining battery level is lower than the third threshold, the third threshold being lower than the first threshold.

4. An electronic device, comprising:
a charging power determining section configured to determine a state of charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold;

a control section configured to control the electronic device to display a result of determination made by the charging power determining section; and a temperature sensor configured to detect an internal temperature of the electronic device, the control section (i) referring to information which indicates whether or not the internal temperature detected by the temperature sensor is equal to or higher than a predetermined temperature threshold, (ii) determining, in a case where the internal temperature is equal to or higher than the predetermined temperature threshold, that the internal temperature is high, and (iii) reducing the charging power in a case where it is determined that the internal temperature is high.

5. The electronic device as set forth in claim 4, wherein:

the control section controls the electronic device to display a reduction in charging power made by the control section.

6. An electronic device, comprising:

a charging power determining section configured to determine a state of charging power with respect to a remaining battery level, with reference to (i) information which indicates whether or not the remaining battery level of a rechargeable battery is lower than a first threshold and (ii) information which indicates whether or not the charging power, which is supplied from an external device to the rechargeable battery, is lower than a second threshold; and a control section configured to control the electronic device to display a result of determination made by the charging power determining section;

the control section invoking a restriction on a processing speed of the electronic device, in a case where the remaining battery level is lower than a third threshold which is lower than the first threshold; and the control section removing the restriction, in a case where the remaining battery level is equal to or higher than the third threshold or in a case where the remaining battery level is lower than the first threshold and the charging power is equal to or higher than the second threshold.

* * * * *